United States Patent
Moon

(10) Patent No.: US 7,342,418 B2
(45) Date of Patent: Mar. 11, 2008

(54) LOW VOLTAGE DIFFERENTIAL SIGNAL RECEIVER

(75) Inventor: Hong Shik Moon, Seoul (KR)

(73) Assignee: LG Electronics Inc., Seoul (KR)

(*) Notice: Subject to any disclaimer, the term of this patent is extended or adjusted under 35 U.S.C. 154(b) by 62 days.

(21) Appl. No.: 11/372,811

(22) Filed: Mar. 9, 2006

(65) Prior Publication Data

US 2006/0214692 A1  Sep. 28, 2006

(30) Foreign Application Priority Data

Mar. 11, 2005 (KR) .................. 10-2005-0020702

(51) Int. Cl.
*H03K 19/094* (2006.01)
*H03K 19/0175* (2006.01)
*H03F 3/45* (2006.01)

(52) U.S. Cl. .................. 326/83; 326/86; 326/87; 330/253

(58) Field of Classification Search .......... 326/68, 326/80–83, 86–87; 330/253, 258–259; 327/333
See application file for complete search history.

(56) References Cited

U.S. PATENT DOCUMENTS

| | | | | |
|---|---|---|---|---|
| 6,052,025 A | * | 4/2000 | Chang et al. | 330/253 |
| 6,781,460 B2 | * | 8/2004 | Crain et al. | 330/253 |
| 6,870,424 B2 | * | 3/2005 | Pradhan et al. | 330/253 |

* cited by examiner

*Primary Examiner*—Rexford Barnie
*Assistant Examiner*—Jason Crawford
(74) *Attorney, Agent, or Firm*—Lee, Hong, Degerman, Kang & Schmadeka

(57) ABSTRACT

An LVDS receiver of the present invention rapidly restores an LVDS inputted at a high speed into a full swing signal of CMOS or TTL level.

A common mode shifter amplifies an LVDS contained in a common mode signal and then shifts a level of the common mode signal. Further, an intermediate amplifying unit amplifies a signal outputted from the common mode shifter to have a margin above and below a threshold voltage in a predetermined logic lever. In addition, an output buffer unit amplifies a signal outputted from the intermediate amplifying unit to produce a full swing signal.

11 Claims, 5 Drawing Sheets

(a)  (b)  (c)

LOW VOLTAGE DIFFERENTIAL SIGNAL RECEIVER

Pursuant to 35 U.S.C. § 119(a), this application claims the benefit of earlier filing date and right of priority to Korean Application No. 2005-0020702, filed on Mar. 11, 2005, the contents of which is hereby incorporated by reference herein in its entirety.

BACKGROUND

Field of the Invention

This description relates to a low voltage differential signal receiver.

A low voltage differential signal (LVDS) proposed to transmit predetermined data at a high speed has been widely applied to a variety of applications including data transmission between chips, data transmission between boards, and the like.

The LVDS enables fast data conversion using its low amplitude, and a problem related with a reduced noise margin due to the low amplitude of the LVDS can be resolved by transmitting data in a differential signal format.

A differential voltage range of the LVDS and a voltage range of a common mode signal are defined and followed as a standard.

Accordingly, devices for transmitting and receiving the LVDS can be compatible with one another.

Particularly, it is needed that a receiver for receiving the LVDS can correctly detect a minimal differential amplitude signal inputted in a wide input voltage range of the common mode signal in accordance with the standard.

SUMMARY

An object of the present invention is to provide an LVDS receiver capable of rapidly restoring an LVDS inputted at a low voltage level and at a high speed in a wide voltage range of a common mode signal into a full swing signal of complementary metal-oxide semiconductor (CMOS) or transistor-transistor logic (TTL) level.

In order to achieve the aforementioned object, the LVDS receiver of the present invention is configured to generate a differential signal by doubly amplifying an LVDS inputted in the wide input voltage range of the common mode signal with a common mode shifter and shifting the voltage level of the common mode signal to an intermediate level of a power supply voltage.

The common mode shifter can receive, without loss, all of the high-speed LVDS contained in the common mode signal. Further, although current consumption is greatly increased if the size of transistor is increased to amplify the input signal nearly to a full swing signal directly in the first stage of the input signal, the current consumption can be reduced if the common mode shifter is used.

In addition, the LVDS receiver includes an intermediate amplifying unit to sufficiently amplify the differential signal generated by the common mode shifter to a signal having a predetermined margin above and below a threshold voltage at a predetermined logic level.

Further, the LVDS receiver includes an output buffer unit to amplify a signal outputted from the intermediate amplifying unit to a full swing signal.

According to an aspect of the present invention for achieving the object, there is provided an LVDS receiver, comprising a common mode shifter for shifting a level of a common mode signal and amplifying an LVDS contained in the common mode signal, an intermediate amplifying unit for amplifying a signal outputted from the common mode shifter, and an output buffer unit for amplifying a signal outputted from the intermediate buffer unit to produce a full swing signal.

DETAILED DESCRIPTION OF THE INVENTION

Figure 1:
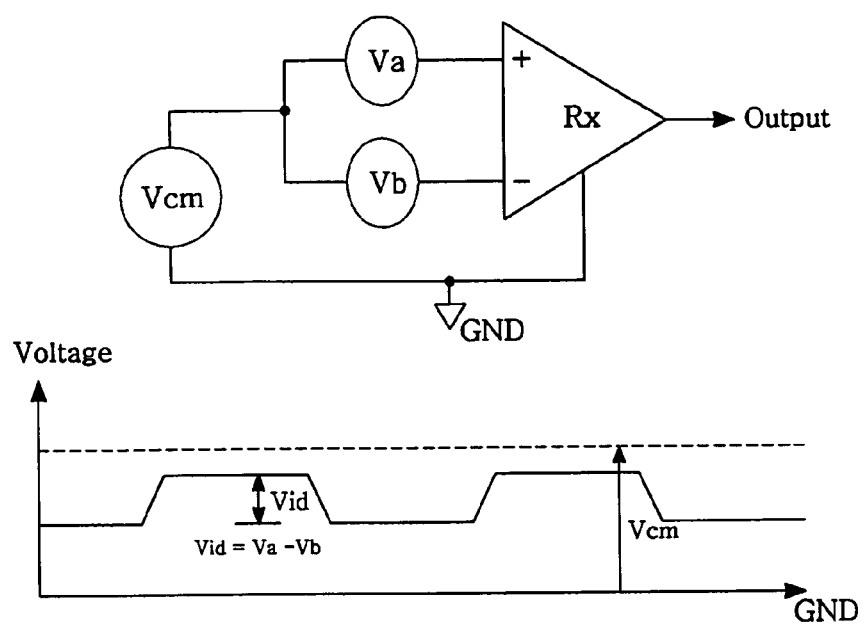
FIG. 1 is a diagram illustrating a standard of an LVDS interface.

FIG. 1 is a diagram illustrating an LVDS inputted to a receiver in accordance with the TIA/EIA (Telecommunications Industry Association/Electronics Industry Association) 644 as a standard of an LVDS interface.

Referring to FIG. 1, a range of a common mode signal voltage (Vcm) is defined from 0 V to 2.4 V. A voltage (Vid) of an LVDS contained in the voltage range of the common mode signal is defined to range from 100 mV to 600 mV.

For example, if the voltage (Vid) of the LVDS is 100 mV, the voltage (Vcm) of the common mode signal ranges 0.05 to 2.35 V. Further, if the voltage (Vid) of the LVDS is 600 mV, the voltage (Vcm) of the common mode signal ranges from 0.3 to 2.1 V.

The receiver for receiving this LVDS should be able to detect and restore the LVDS with a voltage range of 100-600 mV from the common mode signal with a voltage range of 0-2.4 V.

Figure 2:
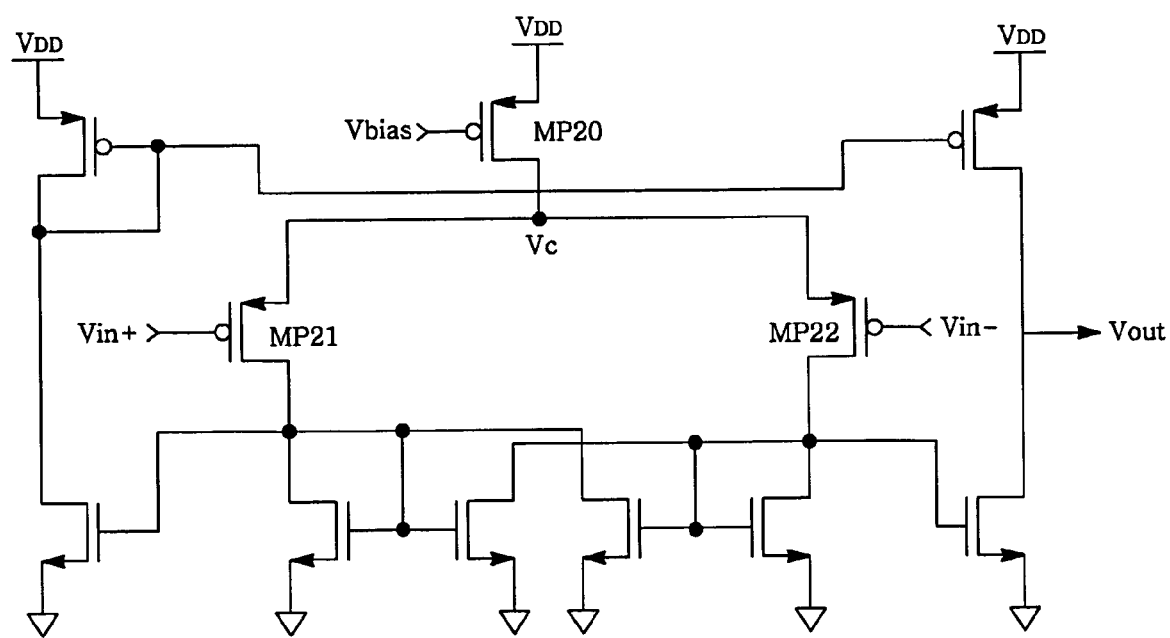
FIG. 2 is a circuit diagram showing an example of an LVDS receiver.

FIG. 2 is a circuit diagram showing an example of the LVDS receiver. A power supply terminal ($V_{DD}$) of the LVDS receiver shown in FIG. 2 is supplied with a voltage of 3.3 V. Input signals (Vin+, Vin−), each of which corresponds to an LVDS, are inputted to gates of PMOS transistors (MP21, MP22), respectively.

A PMOS transistor (MP20) is connected between the power supply terminal ($V_{DD}$) and the PMOS transistors (MP21, MP22). The PMOS transistor (MP20) serves as a constant current source by a constant bias voltage (Vbias)

Assuming that both of the threshold voltages ($|V_{th}|$) of PMOS and NMOS transistors are 0.7 V, a drain voltage (Vc) of the PMOS transistor (MP20) is about 3.0 V when the voltages of the common mode signals (Vin+, Vin−) applied to the gates of the PMOS transistors (MP21, MP22) are 2.3 V.

Therefore, since the voltage (Vds) between the drain and source of the PMOS transistor (MP20) has a margin of about 0.3 V ($=V_{DD}$−Vc), the PMOS transistor (MP20) can be operated in a saturation region.

In this case, an input range of the common mode signal voltage (Vcm) can be expressed as the following Equation 1:

$$\alpha V \leq V_{cm} \leq V_{DD} - 2V - |V_{th}| \quad (1)$$

where αV is a voltage (Vds) between the drain and source of the PMOS transistor (MP20) required to operate the PMOS transistor (MP20) in the saturation region.

Assuming that the voltage (Vds) between the drain and source of the PMOS transistor (MP20) is 0 V, Equation 1 can be changed into the following Equation 2:

$$0 \leq V_{cm} \leq V_{DD} - |V_{th}| \quad (2)$$

Thus, if the voltage of the power supply terminal ($V_{DD}$) is 3.3 V and the threshold voltages ($|V_{th}|$) of the PMOS and NMOS transistors are 0.7 V, the common mode signal voltage (Vcm) is within a range of 0-2.6 V. Accordingly, the LVDS receiver of the present invention can satisfy the LVDS standard.

However, if the voltage of the power supply terminal ($V_{DD}$) is 2.5 V, the operating voltage (Vcm) of the common mode signal is 1.8 V. Thus, the LVDS receiver cannot satisfy the LVDS standard.

Further, the receiver of FIG. 2 requires an additional bias circuit for supplying a bias voltage of a predetermined level in order to operate the PMOS transistor (MP20) as a constant current source. Furthermore, if the receiver shares a single bias circuit to form a plurality of channels, input signals of the channels are coupled with one another through the shared bias circuit, and thus, the channels may become noise sources which affect the other channels depending on data patterns of the other channels.

Moreover, since output capacitive load of the receiver become large if the size of a buffer connected to the next stage is large, the bandwidth is restricted. Thus, since a bias current should be increased to improve the driving capability of the receiver, power consumption of the receiver can be increased.

Figure 3:
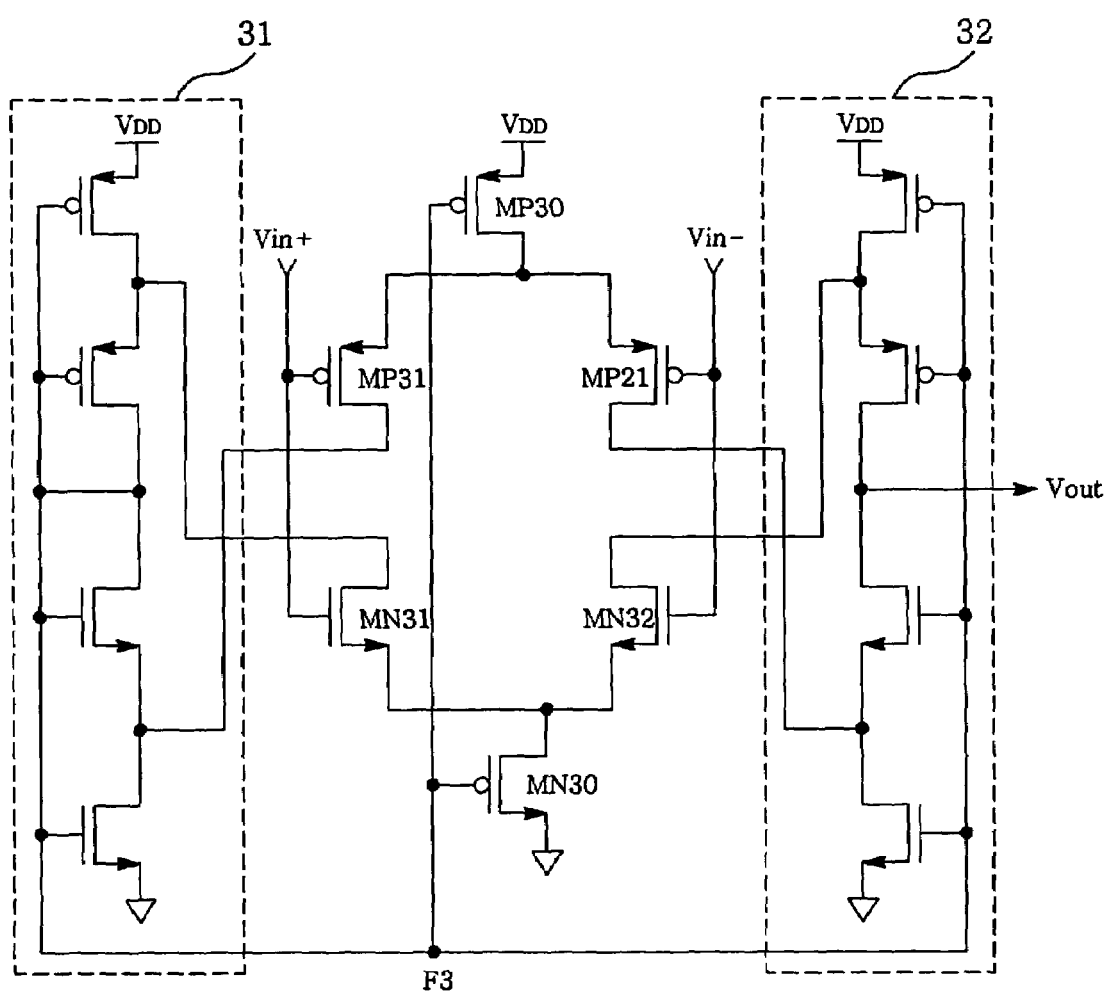
FIG. 3 is a circuit diagram showing another example of the LVDS receiver.

FIG. 3 is a circuit diagram showing the configuration of a receiver having a wide input voltage range of the common mode signal. An input signal (Vin+) is complementarily inputted to a PMOS transistor (MP31) and an NMOS transistor (MN31), while an input signal (Vin−) is complementarily inputted to a PMOS transistor (MP32) and an NMOS transistor (MN32).

A PMOS transistor (MP30) and an NMOS transistor (MN30) serve as constant current sources according to constant bias voltages.

The PMOS transistor (MP31) and the NMOS transistor (MN31) are connected to a folded cascode circuit (31), while the PMOS transistor (MP32) and the NMOS transistor (MN32) are also connected to a folded cascode circuit (32).

The PMOS transistor (MP30) and the NMOS transistor (MN30), each serving as a constant current source, are self-biased through a common node (N3) of the folded cascode circuits (31, 32). That is, the gates of the PMOS transistor (MP30) and the NMOS transistor (MN30) are commonly connected to the gates of the PMOS transistor and the NMOS transistor of the folded cascode circuits (31, 32), so that the PMOS transistor (MP30) and the NMOS transistor (MN30) are self-biased in a negative feedback form.

The circuit of FIG. 3 has a wide input voltage range between a ground voltage (GND) and the voltage of the power supply terminal ($V_{DD}$) by means of a complementary type of input and the folded cascode circuits (31, 32).

Further, contrary to the receiver of FIG. 2 using a fixed bias current, the receiver of FIG. 3 uses a self-bias current. Thus, the PMOS transistor (MP30) and the NMOS transistor (MN30) can be operated in a linear region even in a case where the voltages of the input signals (Vin+, Vin−) are high.

Therefore, since a large current is outputted from an output (Vout) without supplying a large static bias current, the receiver of FIG. 3 can obtain a high output signal which can fully swing between almost the ground voltage (GND) and the voltage of the power supply terminal ($V_{DD}$).

As described above, the receiver of FIG. 3 has many advantages over the receiver of FIG. 2.

However, if the LVDS is converted into the CMOS or TTL level signal while the data rate of the input signals (Vin+ and Vin−) is high, an inter-symbol interference (ISI) phenomenon can occur depending upon data patterns of the input signals (Vin+, Vin−).

That is, if the LVDS to be inputted is changed from a low frequency data pattern to a high frequency data pattern, the swing of the output signal for the low frequency input data reaches a full swing. Therefore, since the high frequency data with a narrow pulse width do neither obtain a sufficient swing nor reach a logic level threshold voltage, the data may be lost.

Figure 4:
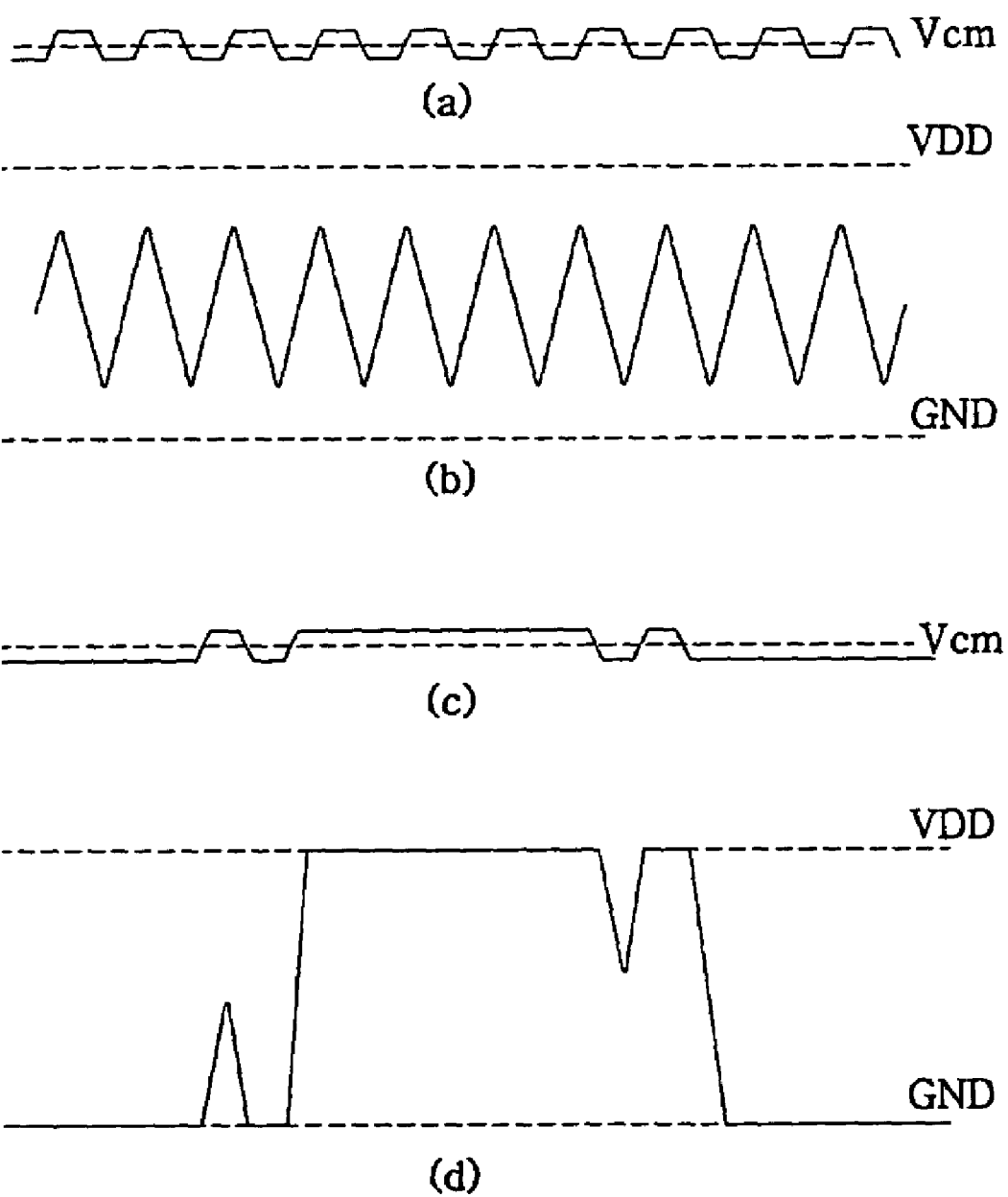
FIGS. 4a to 4d are waveform diagrams each illustrating an error which can occur in the LVDS receiver of FIG. 3.

Referring to FIG. 4, in a case where the LVDS is rapidly inputted to the receiver of FIG. 3 as shown in FIG. 4(a), the output signal does not reach a full swing as shown in FIG. 4(b). Thus, the data can be correctly restored. That is, since the logic level threshold voltage of the buffer connected to the next stage is about a half of the voltage applied to the power supply terminal, the data can be correctly restored.

However, in a case where the LVDS is slowly inputted to the receiver as shown in FIG. 4(c), the output signal reaches a full swing as shown in FIG. 4(d). Thus, the data with a narrow pulse width positioned in the middle portion will be lost.

The reason is that the receiver cannot have a charge or discharge time enough to change the previous output value in response to the high frequency data in an output state where the low frequency data are restored into the full swing signal.

In this case, the data are lost or restored in a very short pulse (or glitch) form.

Figure 5:
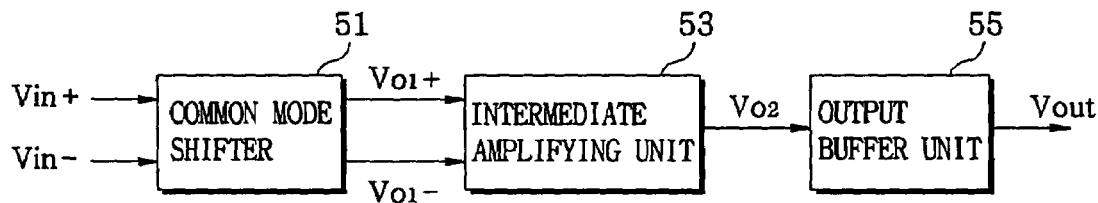
FIG. 5 is a block diagram illustrating the configuration of an LVDS receiver according to the present invention.

FIG. 5 is a block diagram showing the configuration of the receiver according to the present invention. As shown in FIG. 5, the LVDS receiver of the present invention comprises a common mode shifter (51), an intermediate amplifying unit (53) and an output buffer unit (55).

The common mode shifter (51) receives an LVDS in a wide input voltage range of a common mode signal of 0 V to 2.4 V, shifts the received LVDS to an LVDS with an intermediate level, doubly amplifies the shifted LVDS, loads the amplified LVDS on the common mode signal, and then outputs the LVDS to the intermediate amplifying unit (53).

The intermediate amplifying unit (53) amplifies the LVDS inputted from the common mode shifter (51) such that the LVDS has a predetermined margin voltage above and below the threshold voltage of a logic level such as a CMOS logic, and then outputs the amplified LVDS as a single ended signal.

As described later, the intermediate amplifying unit (53) can be preferably implemented by a self-biased complementary differential amplifier.

The output buffer unit (55) amplifies the single ended signal inputted from the intermediate amplifying unit (53) with a push-pull amplifier, an inverter, etc. to convert the signal into a full swing signal.

Figure 6:
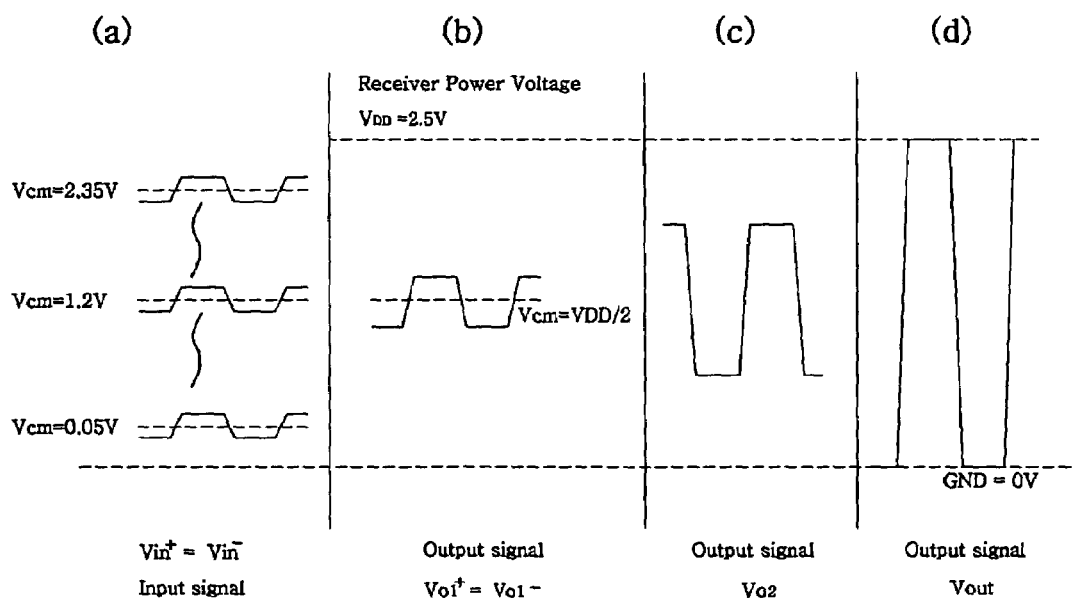
FIG. 6 is a waveform diagram illustrating the operation of each unit of FIG. 5.

For example, as shown in FIG. 6(a), the LVDS contained in the common mode signal voltage (Vcm; 2.35 V, 1.2 V or 0.05 V) is inputted to the common mode shifter (51). As shown in FIG. 6(b), the common mode shifter (51) shifts the voltage level of the common mode signal to a half of the voltage (i.e., $V_{DD}/2$) supplied to the power supply terminal ($V_{DD}$). Then, the common mode shifter (51) amplifies the LVDS contained in the common mode signal to a predetermined level to output the amplified LVDS to the intermediate amplifying unit (53).

The intermediate amplifying unit (53) amplifies the signal inputted from the common mode shifter (51) to an adequate degree as shown in FIG. 6(c) and then outputs the amplified signal to the output buffer unit (55). That is, the intermediate amplifying unit (53) amplifies the input signal to a sufficient degree to drive the logic level threshold voltage and to exhibit appropriate driving capability.

As shown in FIG. 6(d), the output buffer unit (55) converts the signal inputted from the intermediate amplifying unit (53) into a signal fully swung between the voltage of the power supply terminal ($V_{DD}$) and the ground voltage (GND).

In other words, the common mode shifter (51) restricts the input signal to an output swing with a low gain but a wide voltage range of the input common mode signal, the intermediate amplifying unit (53) amplifies the signal enough to exhibit high gain and driving capability, and the output buffer unit (55) finally converts the amplified signal into a final full swing output signal with a push-pull amplifier, an inverter, etc. In this way, the LVDS receiver with a large data bandwidth can be implemented.

Figure 7:
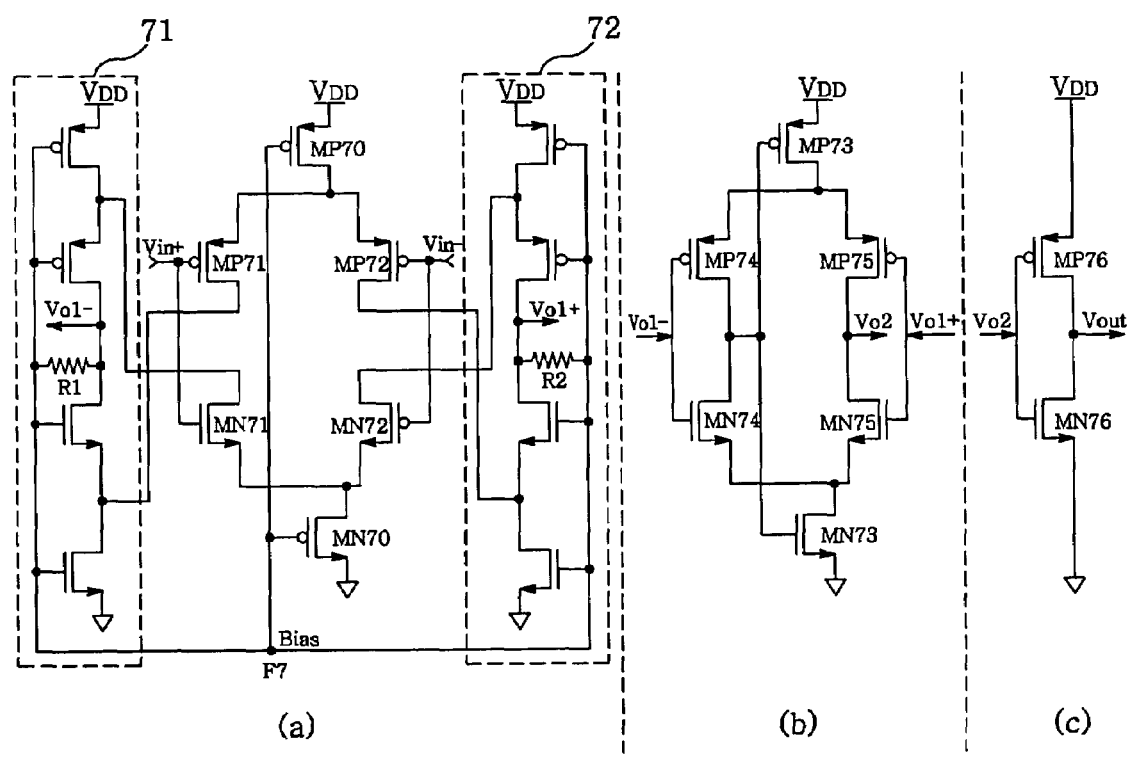
FIG. 7 is a circuit diagram showing the detailed configuration of the LVDS receiver according to the present invention.

FIG. 7 is a detailed circuit diagram showing the configuration of the LVDS receiver according to the present invention. In FIG. 7, (a) shows the common mode shifter (51), (b) shows the intermediate amplifying unit (53) and (c) shows the output buffer unit (55).

Referring to FIG. 7(a), the common mode shifter (51) comprises an input stage for receiving a non-inverted differential signal (Vin+) and an inverted differential signal (Vin−), each corresponding to LVDS, and an output stage for outputting differential signals (Vol+, Vol−). Here, the non-inverted differential signal (Vin+) is commonly inputted to the gates of a PMOS transistor (MP71) and an NMOS transistor (MN71), while the inverted differential signal (Vin−) is commonly inputted to the gates of a PMOS transistor (MP72) and an NMOS transistor (MN72).

In other words, the non-inverted differential signal (Vin+) is inputted to the gates of the PMOS transistor (MP71) and the NMOS transistor (MN71) in a complementary form, while the inverted differential signal (Vin−) is inputted to the gates of a PMOS transistor (MP72) and an NMOS transistor (MN72) in a complementary form.

Further, a PMOS transistor (MP70) and an NMOS transistor (MN70) serve as constant current sources according to constant bias currents.

The non-inverted differential signal (Vin+) inputted to the PMOS transistor (MP71) and the NMOS transistor (MN71) and the inverted differential signal (Vin−) inputted to the PMOS transistor (MP72) and the NMOS transistor (MN72) are amplified by folded cascode amplifying units (71, 72).

Further, a common node (F7) of the folded cascode amplifying units (71, 72) is connected to the gates of the PMOS transistor (MP70) and the NMOS transistor (MN70) such that the transistors are self-biased.

The common mode shifter (51) so configured converts the non-inverted differential signal (Vin+) and the inverted differential signal (Vin−) into fully differential signals (Vol+, Vol−) and then outputs the converted signals.

Output resistors (R1, R2) are connected between the output stages for outputting the fully differential signals (Vol+, Vol−) and the common s (F7), respectively. The output resistors (R1, R2) construct a common mode feedback to reduce an output impedance of the output stage.

In this case, resistance values of the output resistors (R1, R2) are set in such a manner that the amplifying gain of the common mode shifter (51) becomes about 2 times, i.e. 6 dB.

The common mode signal voltage level of the differential signals (Vol+, Vol−) outputted to the output stage by the common mode shifter (51) is shifted to a level corresponding to a half of the power supply voltage supplied to the power supply terminal ($V_{DD}$) due to the common mode feedback by the resistors (R1, R2)

Therefore, the output signals (Vol+, Vol−) of the common mode shifter (51) are in the form of a voltage with an amplitude of about $V_{DD}/2$ containing doubly amplified differential signals (Vin+, Vin−).

In this manner, the common mode shifter (51) can rapidly respond to the differential input signal by shifting the voltage level of the common mode signal and reducing the gain. Accordingly, this receiver can solve the problem of data loss due to the difference in swing widths according to the data patterns as occurred in the receiver of FIG. 3, and thus, it is possible to more rapidly receive the data.

Further, since the common mode shifter (51) restricts the swing width for a differential signal type of output signal, a peak current generated on the transition can be reduced to be able to use a low voltage of about 2.5 V, so that total power consumption can be reduced.

The intermediate amplifying unit (53) can be simply implemented because the unit does not require a wide input voltage range of the common mode signal.

Referring to FIG. 7(b), the intermediate amplifying unit (53) can be implemented by using a complementary differential amplifier for amplifying the output signal from the common mode shifter (51).

In this case, the inverted output signal (Vol−) of the common mode shifter (51) is commonly inputted to the gates of a PMOS transistor (MP74) and an NMOS transistor (MN74), while the non-inverted output signal (Vol+) of the common mode shifter (51) is commonly inputted to the gates of a PMOS transistor (MP75) and an NMOS transistor (MN75). That is, the differential output signals (Vol+, Vol−) of the common mode shifter (51) are inputted to a differential input stage of the intermediate amplifying unit (53).

Further, a PMOS transistor (MP73) and an NMOS transistor (MN73) serve as constant current sources according to a predetermined level of bias voltage applied to the gates thereof, and the common node of the PMOS transistor (MP74) and the NMOS transistor (MN74) is connected to a bias supply node such that the transistors are self-biased.

The signal amplified by the intermediate amplifying unit (53) is outputted from the common node of the PMOS transistor (MP75) and the NMOS transistor (MN75) in the form of a single ended signal.

In this case, according to the present invention, the intermediate amplifying unit (53) sufficiently amplifies the differential output signals (Vol+, Vol−) of the common mode shifter (51), so that the output buffer unit (55) connected to the next stage can be rapidly operated in such a full swing manner as to have a sufficient margin above and below the threshold voltage.

In particular, even though the output buffer unit (55) is configured to drive large load, the intermediate amplifying unit (53) can be configured to have a margin capable of driving the load to a certain degree.

The output buffer unit (55) finally outputs a signal with predetermined logic level (e.g., a CMOS logic level) and can be implemented by using a push-pull amplifier.

For example, the output buffer unit (55) can be implemented by a CMOS inverter for inverting an input single ended signal outputted from the intermediate amplifying unit (53), as shown in FIG. 7(c). That is, the CMOS inverter creates a signal inverted by the intermediate amplifying unit (53) into a signal, which is in the same phase as those of the input signals (Vin+, Vin−) and has a full swing of CMOS level, and then outputs the created signal.

As described above, the LVDS is converted into a signal with a logic level (e.g., a CMOS logic level) through the three signal processing steps.

According to the present invention, a fast LVDS can be rapidly and correctly restored. Therefore, it is possible to increase a processing rate of the LVDS and to rapidly transmit and receive data. Further, since the receiver of the present invention has relatively low power consumption at a high speed, a multi-channel input port can be easily implemented into an IC.

In addition, since the data can be rapidly transmitted and received, an advantage obtained by the replacement of CMOS I/O with LVDS I/O can be maximized.

Although the present invention has been described and illustrated in connection with the specific preferred embodiment, it will be readily understood by those skilled in the art that various modifications and changes can be made thereto without departing from the spirit and scope of the present invention defined by the appended claims. Therefore, such modifications and changes fall within the scope of the present invention.

What is claimed is:

1. A low voltage differential signal (LVDS) receiver, comprising:
   a common mode shifter for shifting a level of a common mode signal and amplifying an LVDS contained in the common mode signal;
   an intermediate amplifying unit for amplifying a signal outputted from the common mode shifter; and
   an output buffer unit for amplifying a signal outputted from the intermediate amplifying unit to produce a full swing signal,
   wherein the common mode shifter comprises:
   two constant current sources;
   a differential amplifying unit provided between the two constant current sources for differentially amplifying the common mode signal containing the LVDS; and
   two folded cascode amplifying units for performing cascode amplification of the signal amplified by the differential amplifying unit and supplying a bias current to the two constant current sources.

2. The LVDS receiver as claimed in claim 1, wherein the common mode shifter shifts the level of the common mode signal to a half of a voltage applied to a power supply terminal.

3. The LVDS receiver as claimed in claim 1, wherein the common mode shifter doubly amplifies the LVDS.

4. The LVDS receiver as claimed in claim 1, further comprising output resistors for constructing common mode feedbacks between a node for supplying the bias voltage and each output stage of the two folded cascode amplifying units, to reduce an amplifying gain.

5. The LVDS receiver as claimed in claim 1, wherein the intermediate amplifying unit amplifies the signal outputted from the common mode shifter to have a margin above and below a threshold voltage in a predetermined logic level.

6. The LVDS receiver as claimed in claim 5, wherein the logic level is a CMOS or TTL level.

7. The LVDS receiver as claimed in claim 1, wherein the intermediate amplifying unit includes a complementary differential amplifier for amplifying the signal outputted from the common mode shifter.

8. The LVDS receiver as claimed in claim 7, further comprising:
   a constant current source for supplying a constant current from a power supply terminal to the complementary differential amplifier; and
   a constant current source for allowing the constant current to flow from the complementary differential amplifier to a ground.

9. The LVDS receiver as claimed in claim 1, wherein the output buffer unit is a push-pull amplifier.

10. The LVDS receiver as claimed in claim 1, wherein the output buffer unit is an inverter.

11. The LVDS receiver as claimed in claim 10, wherein the inverter is an inverter comprising a PMOS transistor and an NMOS transistor which are serially connected between a power supply terminal and a ground.

* * * * *